(12) United States Patent
Goggin et al.

(10) Patent No.: US 9,960,570 B1
(45) Date of Patent: May 1, 2018

(54) HEAT-ASSISTED MAGNETIC RECORDING DEVICE HAVING EXTERNAL CAVITY LASER WITH SLOT WAVEGUIDE

(71) Applicant: Seagate Technology LLC, Cupertino, CA (US)

(72) Inventors: Aidan Dominic Goggin, Donegal (IE); Mark Anthony Gubbins, Donegal (IE); Michael James Hardy, Londonderry (GB); Kelly Elizabeth Hamilton, Derry (GB)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days. days.

(21) Appl. No.: 15/601,024

(22) Filed: May 22, 2017

Related U.S. Application Data

(60) Provisional application No. 62/341,828, filed on May 26, 2016.

(51) Int. Cl.
| | |
|---|---|
| *G11B 11/00* | (2006.01) |
| *H01S 5/14* | (2006.01) |
| *H01S 5/042* | (2006.01) |
| *G11B 5/48* | (2006.01) |
| *G11B 5/00* | (2006.01) |
| *G11B 7/126* | (2012.01) |
| *G11B 5/60* | (2006.01) |

(52) U.S. Cl.
CPC .............. *H01S 5/14* (2013.01); *G11B 5/4866* (2013.01); *H01S 5/042* (2013.01); *G11B 5/6088* (2013.01); *G11B 7/126* (2013.01); *G11B 2005/0021* (2013.01)

(58) Field of Classification Search
None
See application file for complete search history.

(56) References Cited

U.S. PATENT DOCUMENTS

| | | |
|---|---|---|
| 9,129,634 B1 | 9/2015 | Boone, Jr. et al. |
| 2001/0010599 A1 | 8/2001 | Lafevre |
| 2004/0062152 A1* | 4/2004 | Stancil .................. B82Y 10/00 369/13.33 |
| 2006/0228074 A1* | 10/2006 | Lipson .................. B82Y 20/00 385/42 |

(Continued)

OTHER PUBLICATIONS

Tanaka et al., "Hybrid-Integrated External-Cavity Laser Without Temperature-Dependent Mode Hopping", Journal of Lightwave Technology, vol. 20, No. 9, Sep. 2002, pp. 1730-1739.

*Primary Examiner* — Tan X Dinh
(74) *Attorney, Agent, or Firm* — Hollingsworth Davis, LLC

(57) ABSTRACT

A slider includes a slot waveguide configured to receive energy from an input surface. The slot waveguide has first and second high-index regions surrounding a middle region that extends along a light propagation direction. The middle region has a refractive index less than that of the first and second high index regions. A near-field transducer is at an output portion of the middle region at media-facing surface. The near-field transducer has first and second plates parallel to the media-facing surface with a gap therebetween. An active laser region has a front facet optically coupled to the input surface of the slider. A reflective back facet of the laser and the near-field transducer define a single optical resonator.

20 Claims, 10 Drawing Sheets

(56) References Cited

U.S. PATENT DOCUMENTS

| | | | |
|---|---|---|---|
| 2008/0068748 A1* | 3/2008 | Olson | G11B 5/02 369/13.33 |
| 2009/0116804 A1* | 5/2009 | Peng | G11B 5/314 369/13.33 |
| 2012/0327754 A1 | 12/2012 | Olson | |
| 2013/0064051 A1* | 3/2013 | Peng | G11B 5/3133 369/13.33 |
| 2013/0064502 A1* | 3/2013 | Peng | G11B 5/6088 369/13.33 |
| 2013/0071062 A1* | 3/2013 | Peng | G11B 5/314 369/13.33 |
| 2015/0364899 A1* | 12/2015 | Tatah | H01S 5/141 369/13.33 |
| 2016/0293189 A1* | 10/2016 | Yang | G02B 6/126 369/13.33 |

* cited by examiner

US 9,960,570 B1

HEAT-ASSISTED MAGNETIC RECORDING DEVICE HAVING EXTERNAL CAVITY LASER WITH SLOT WAVEGUIDE

RELATED PATENT DOCUMENTS

This application claims the benefit of Provisional Patent Application Ser. No. 62/341,828 filed on May 26, 2016, to which priority is claimed pursuant to 35 U.S.C. § 119(e), and which is incorporated herein by reference in its entirety.

SUMMARY

The present disclosure relates to an external cavity laser with a slot waveguide. In one embodiment, a slider includes a slot waveguide configured to receive energy from an input surface. The slot waveguide has first and second high-index regions surrounding a middle region that extends along a light propagation direction. The middle region has a refractive index less than that of the first and second high index regions. A near-field transducer is at an output portion of the middle region at media-facing surface. The near-field transducer has first and second plates parallel to the media-facing surface with a gap therebetween. An active laser region has a front facet optically coupled to the input surface of the slider. A reflective back facet of the laser and the near-field transducer define a single optical resonator.

In another embodiment, a slider includes a magnetic write pole near a media-facing surface and an external cavity resonator. The external cavity resonator includes an active laser region with a reflective back facet and a front facet. The front facet is optically coupled to an input surface of the slider. The resonator includes a slot waveguide configured to receive energy from the input surface. The slot waveguide has first and second tapered high-index regions surrounding a tapered middle region that extends along a light propagation direction. The middle region has a refractive index less than that of the first and second high index regions.

The resonator also includes a near-field transducer at an output portion of the middle region near the write pole. The near-field transducer has first and second plates parallel to the media-facing surface with a gap therebetween. The energy reflects between the reflective back facet of the active laser region and the first and second plate to amplify the energy. A portion of the energy causing surface plasmons to resonate in the gap. The surface plasmons are directed out of the media-facing surface to form a hot spot on a recording medium while the write pole applies a magnetic field to the hotspot.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
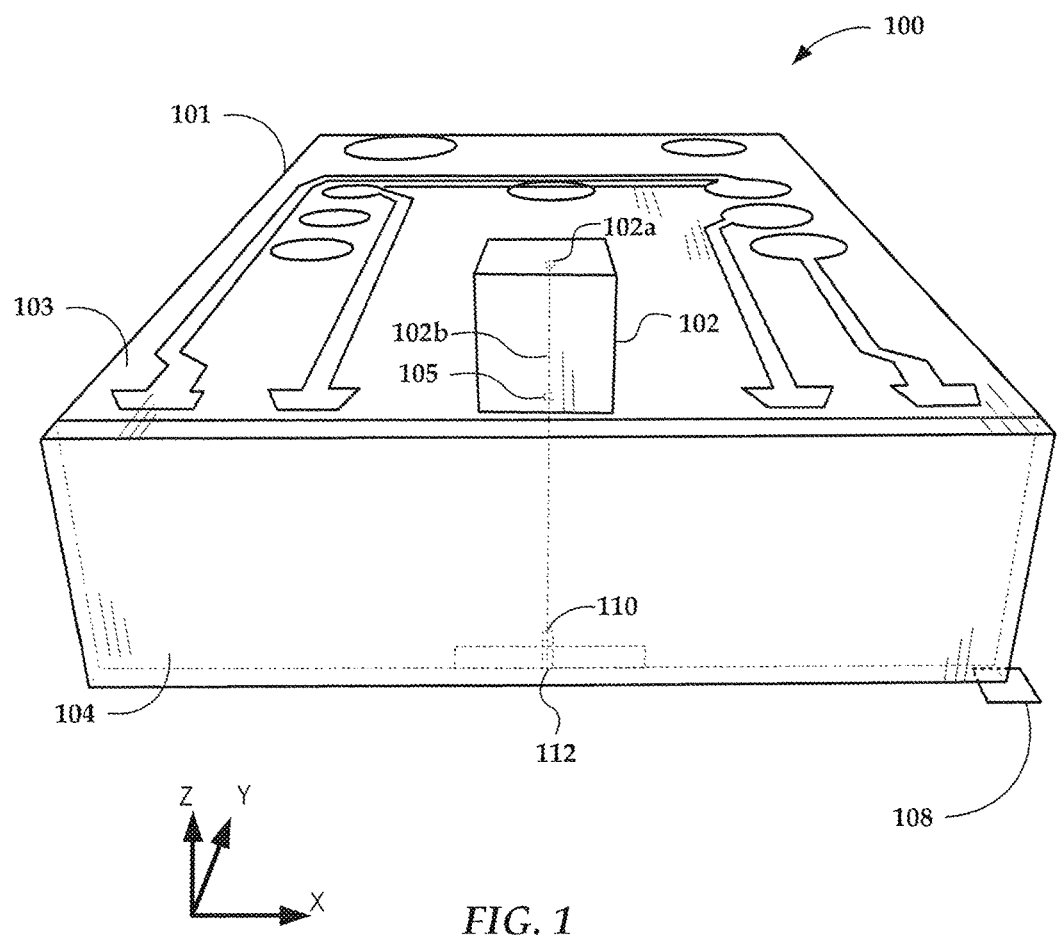
FIG. 1 is a perspective view of a hard drive slider according to an example embodiment.

The present disclosure generally relates to optical systems that deliver energy to a near-field transducer (NFT). An NFT is used in applications such as heat-assisted magnetic recording (HAMR). This recording technology, also referred to as energy-assisted media recording (EAMR), thermally-assisted media recording (TAMR), and thermally-assisted recording (TAR), etc., uses an energy source such as a laser to couple energy to a NFT, which achieves surface plasmon resonance in response. The surface plasmons are directed to heat a small spot on a recording medium (e.g., magnetic disk) during recording. The heat lowers coercivity of the media at the hot spot, allowing a magnetic write pole to locally change magnetic orientation in the recording medium. Due to the relatively high coercivity of the recording medium after cooling, the data is less susceptible to superparamagnetic effects that can lead to data errors.

The present disclosure relates to external cavity lasers that have at least part of the laser integrated into an optical device such as a HAMR read/write head, also referred to as a HAMR slider. In reference to FIG. 1, a perspective view shows a HAMR read/write head 100 according to an example embodiment. The read/write head 100 includes a laser diode 102 located on a top, input surface 103 of a slider body 101. The laser diode 102 will include at least one reflector 102a and an active region 102b (e.g., gain medium) that emits light in response to an electrical current being applied. The light is directed through a laser-to-slider interface 105 into a waveguide 110 that is integrated into the slider body 101.

A near-field transducer 112 is located at an end of the waveguide 110. Optical feedback is induced through reflection between the reflector 102a and the near-field transducer 112, thereby amplifying the light. Some of the amplified light is coupled into the near-field transducer 112, which emits light out of a media-facing surface 108 that is positioned over a surface of a recording media (not shown) during device operation. The emitted energy is used to heat a recording medium (e.g., magnetic disk) as it passes by the read/write head.

In this example, the active region 102b and waveguide 110 are normal to the input surface 103 and media-facing surface 108. The media-facing surface 108 is held proximate to the recording medium while reading and writing data. The media-facing surface 108 may be configured as an air-bearing surface (ABS) that maintains separation from the media via a thin layer of gas, such as air or helium. Optical coupling components, such as the waveguide 110 and near-field transducer 112, are formed integrally within the slider body 101 (near a trailing-edge surface 104, in this example), while the laser diode 102 is manufactured separately and attached (e.g., bonded, soldered) to the input surface 103.

Figure 2:
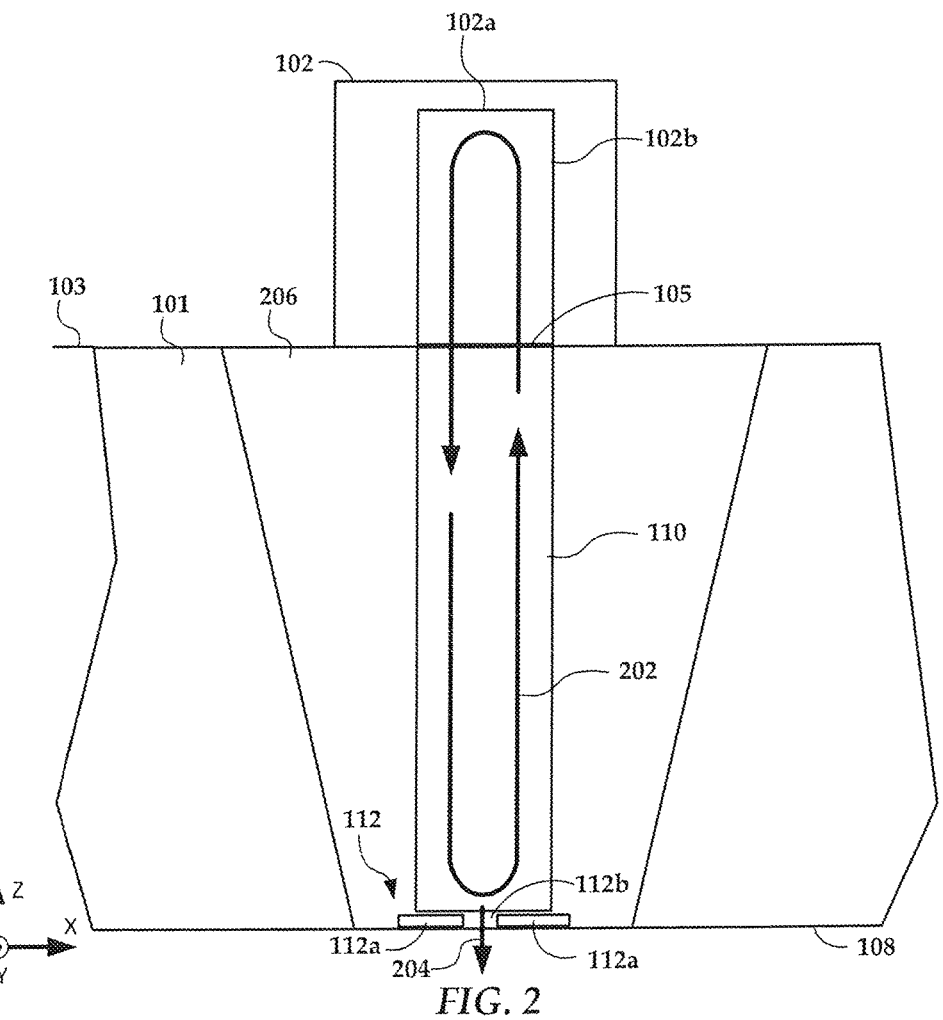
FIG. 2 is an end view of a hard drive slider and media arrangement according to an example embodiment.
Figure 3:
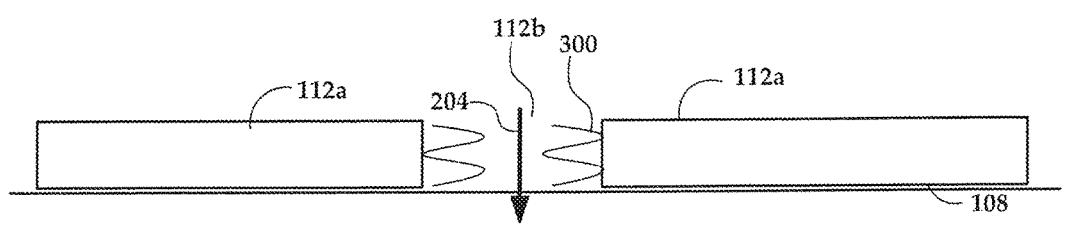
FIG. 3 is a close of view of the near-field transducer shown in FIG. 2.

In FIG. 2, a diagram of the slider trailing edge illustrates operation of the external cavity laser shown in FIG. 1. The interface 105 (which includes facets or windows on both the laser 102 and slider body 101) configured to pass light energy 202 back and forth between the laser 102 and waveguide 110. The near-field transducer 112 includes one or more plates 112a with a slot 112b between the plates 112a. A majority of the light 202 reflects between the plates 112a and the reflector 102a, while a small portion 204 (e.g., 10-15%) of the energy in the waveguide 110 passes into the slot 112b. As shown in the close up view of FIG. 3, the light in the slot 112b causes resonance of surface plasmon polaritons 300 on the inner edges of the slot 112b, and these surface plasmon polaritons 300 are directed out towards the recording medium.

Referring again to FIG. 2, a magnetic write pole 206 is located downtrack of (along the y-direction) the near-field transducer 112 and magnetically coupled to an electrical coil (not shown). Energizing the coil causes changes in magnetic flux through the write pole 206, which changes a magnetic orientation of the heated recording medium as it moves past the write pole in the downtrack direction. A reader stack (not shown) may also be located near the media-facing surface 108, typically in the downtrack direction relative to the write pole 206 and near-field transducer 112.

Figure 4:
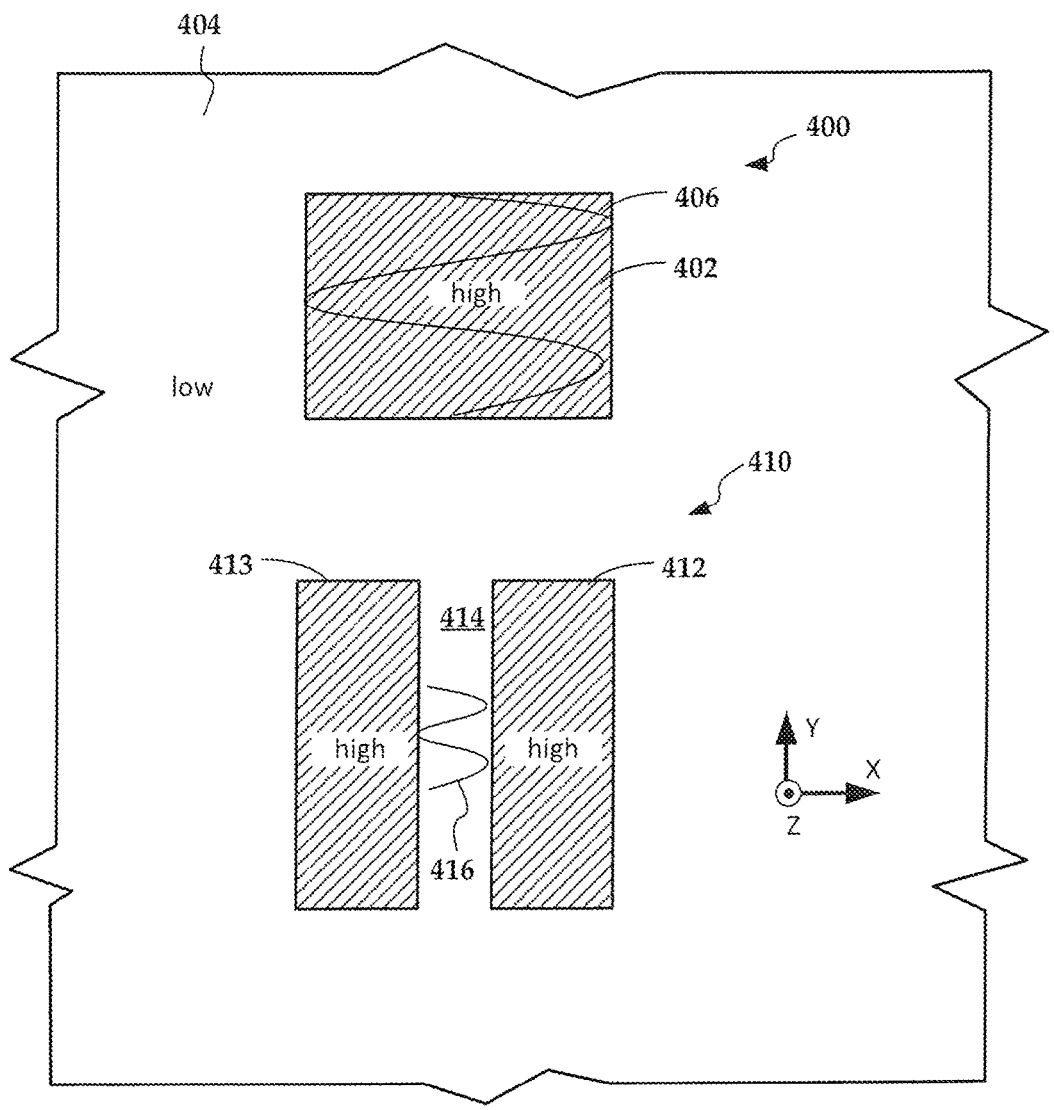
FIG. 4 is a cross-sectional view of a waveguide configuration according to an example embodiment.

The waveguide 110 that serves as part of the external resonant cavity may be configured as a slot waveguide. In FIG. 4, a cross-sectional diagram illustrates a slot waveguide configuration according to an example embodiment. The cross-section in FIG. 4 is taken parallel to the media-facing surface, e.g., the xy-plane in FIG. 2. A conventional waveguide configuration 400 is shown, which includes a high-index of refraction (n) material 402 that is surrounded by lower index material 404. Light 406 propagates through high-index material 402 in the z-direction of the illustrated coordinate system.

Gap waveguide configuration 410 is also shown in FIG. 4. In this configuration 410, the waveguide includes two regions 412, 413 of high-index material separated by a gap 414 of low-index material. The gap waveguide configuration 410 is different from the standard configuration 400 by not only the two regions 412, 413 of the high-index material, but due to light 416 mainly propagating through the low-index gap 414 instead of the high-index regions 412, 413.

While the gap 414 is shown filled by the same low-index material 404 shown surrounding the other waveguide configurations, it will be understood that different low-index materials may be used for all the waveguide configurations and regions therein. Further, additional layers of intermediate index materials may be used between the high index regions and low index regions. For purposes of this disclosure, the term "low-index" material is intended to indicate a value of n that is low relative to the high-index material, and is not intended to limit the low-index or high-index materials to any specific material or material property. Similarly, an intermediate-index material has a value of n between that of the high- and low-index materials, and may include a variety of possible materials.

Figure 5:
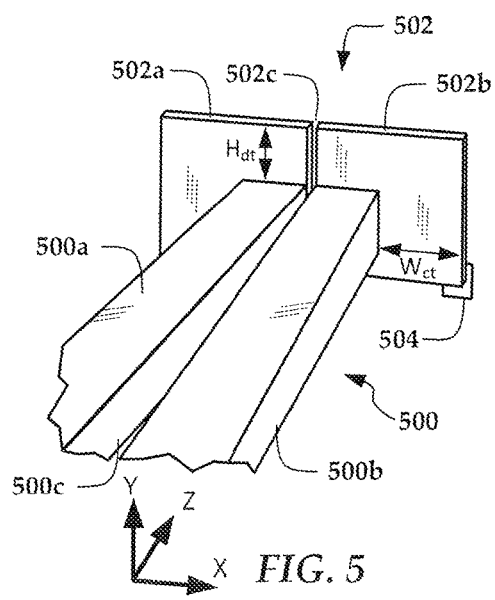
FIGS. 5 and 6 are perspective views of a slot waveguide and near-field transducer according to an example embodiment.
Figure 6:
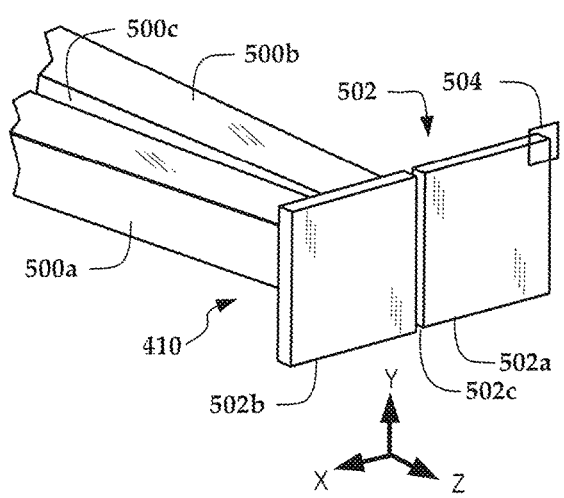

In FIGS. 5 and 6, show perspective views of a slot waveguide 500 and NFT 502 according to an example embodiment. The slot waveguide 500 has first and second high-index regions 500a-b that surround a middle, low-index region 500c. The regions 500a-c extend along a light propagation direction, which in this example is the z-direction. A near-field transducer 502 is located at an output portion of the low-index region 500c at a media-facing surface 504. The near-field transducer 502 has first and second plates 502a-b parallel to the media-facing surface with a gap 502c therebetween.

The plates 502a-b are formed of gold or some other material with desirable plasmonic resonance properties (e.g., silver, copper) as well as desirable reflective properties. The gap 502c may be filled with the same low index material of region 500c. The sides of the plates 502a-b at the media-facing surface 504 may be coated with a mechanical and corrosion resistant layer. The plates 502a-b have a rectangular shape, although other shapes may be used (e.g., half circle, trapezoid, etc.). Generally the edges of the plates 502a-b that define the gap 502c may be linear and parallel to each other as shown, although alternate geometric shapes and relations may be possible for these edges. For example, the edges may be non-parallel and/or curved and/or have features that locally protrude into the gap and/or features that locally widen the gap.

Figure 7:
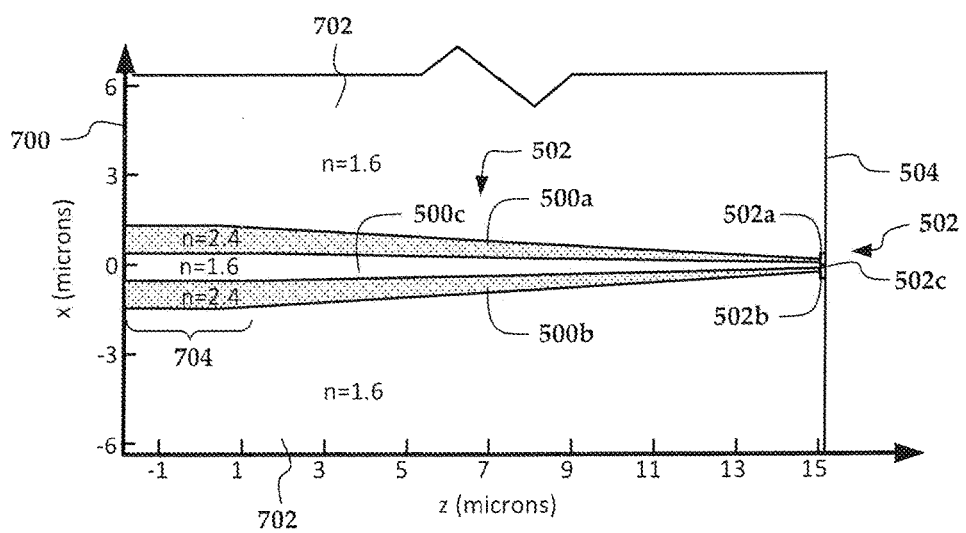
FIGS. 7 and 8 are top and cross-sectional views of a waveguide according to an example embodiment.

In FIG. 7, a top view of the waveguide 500 and NFT 502 of FIGS. 5 and 6 shows sample dimensions and refractive indices of the various components. Seen in this view is an input surface 700 through which light is coupled from an externally mounted laser assembly. Also seen in this view is a low-index material 702 that surrounds the high-index regions 500a-b. Both the high-index regions 500a-b and low-index region 500c transition have a constant cross-track-width profile in input regions 704 near the input surface 700, then taper to lower cross-track widths as the regions 500a-c approach the media facing surface 504.

Figure 8:
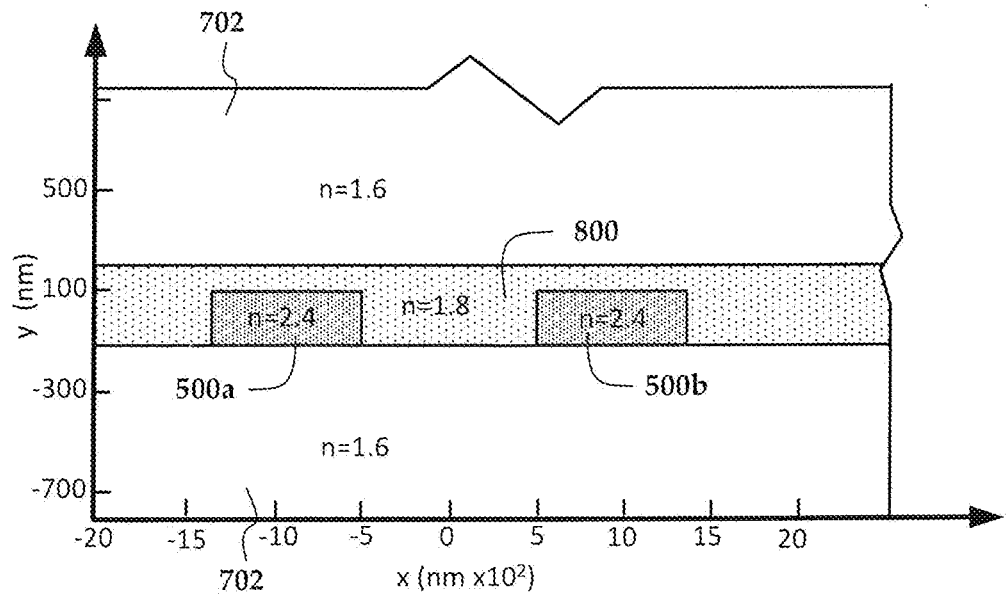

In FIG. 8, a cross-sectional diagram illustrates a waveguide configuration according to an example embodiment. This cross-section generally corresponds to an xy-plane crossing through an input region such as region 704 in FIG. 7. Components in FIG. 8 similar to corresponding components in FIG. 7 are given the same reference numbers in FIG. 8. In this example, an intermediate index layer 800 surrounds three sides of the high-index regions 500a-b, and the low-index material 702 surrounds a fourth, bottom side of the high-index regions 500a-b. The low index material 702 also covers a top side of the intermediate index layer 800 that faces away from the high-index regions 500a-b.

Figure 9:
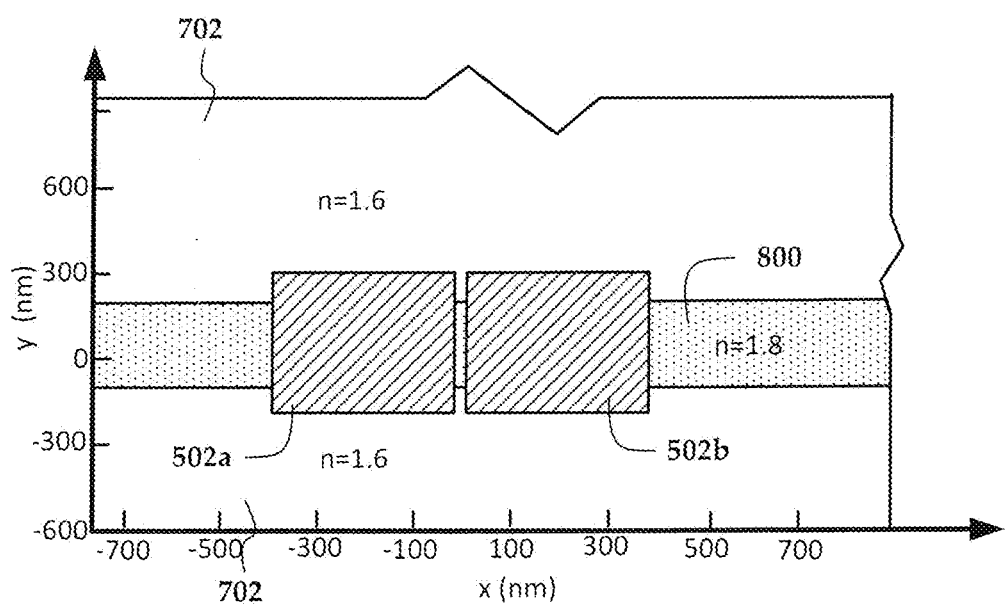
FIG. 9 is an end view of a near-field transducer according to an example embodiment.

In FIG. 9, a view from the media-facing surface shows example dimensions and locations of first and second plates 502a-b. The intermediate-index layer 800 shown in FIG. 8 is used in this configuration. In other embodiments, the low-index material 702 may be used instead of the intermediate-index material 702, at least near the media-facing surface.

Figure 10:
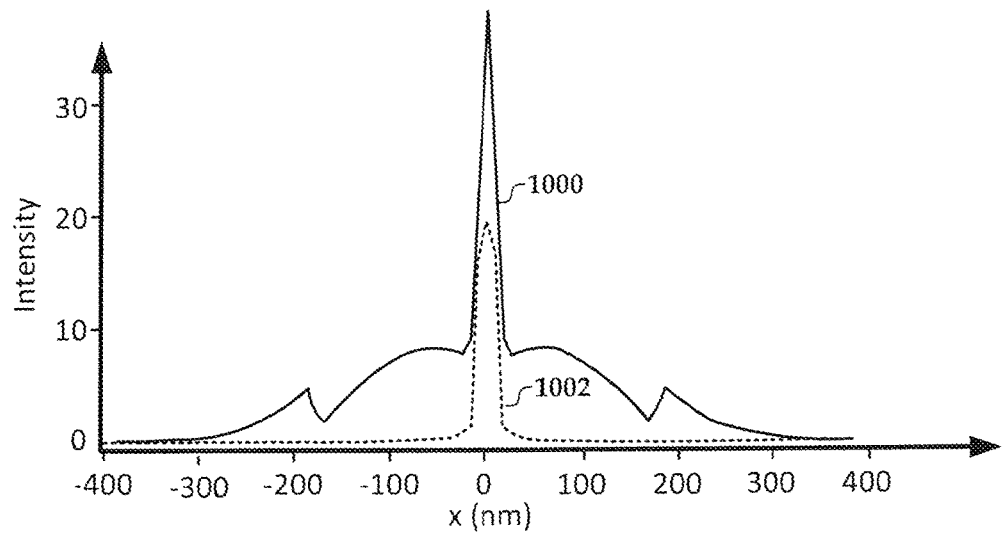
FIG. 10 is a graph showing modeling results for a dual-slot waveguide and near-field transducer according to an example embodiment.

In FIG. 10, a graph shows modeling results for a dual-slot waveguide and NFT according to an example embodiment. These results show intensity of light coupled into the waveguide as a function of cross-track location. Curve 1000 is the intensity profile just before the NFT, e.g., at a surface of the NFT facing away from the media-facing surface. Curve 1002 is the intensity profile through the NFT gap at the media-facing surface. Note that the light in curve 1000 that is by about >50 nm and <−50 nm off-center is reflected back to through the waveguide to maintain the optical feedback in the external laser cavity, resulting in the flattened curve 1002. The center peak of curve 1002 causes surface plasmonic resonance within the NFT gap.

Generally, the modeling shows this design achieves high levels of reflections (70-90%) and the reflections remain in a high-purity, fundamental, transverse electric (TE) mode. This level of reflections/mode purity should work well as a front facet for an external cavity laser.

Figure 11:
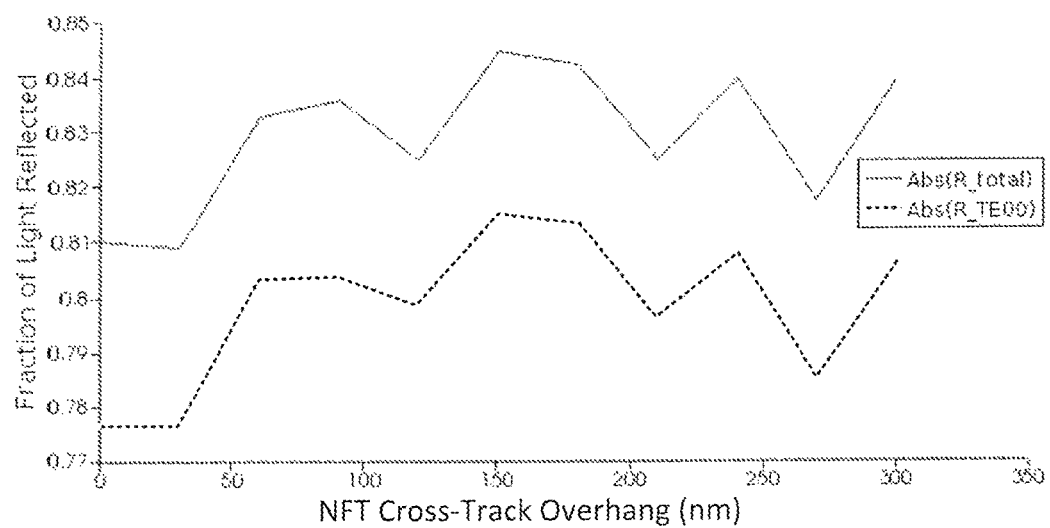
FIGS. 11-18 are plots showing modeling results for slot waveguide and NFT according to example embodiments.
Figure 12:
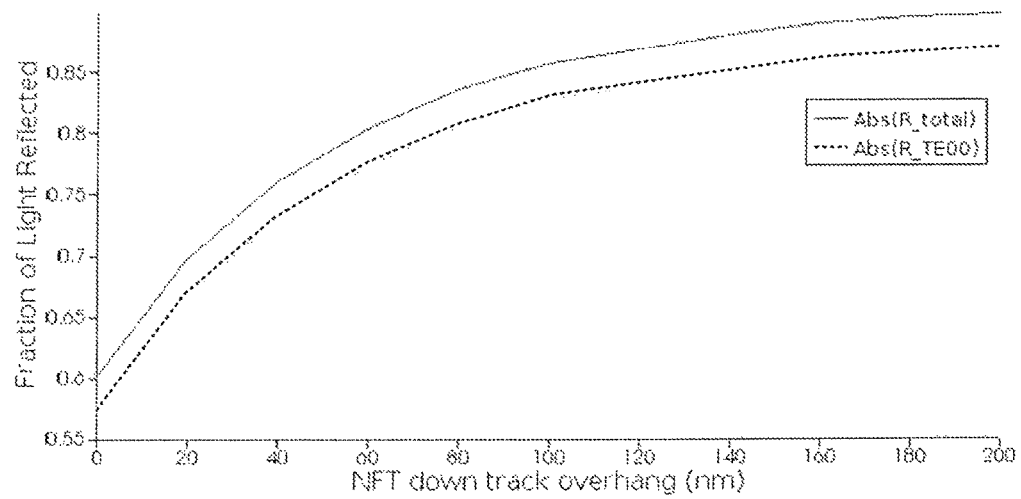

In FIGS. 11-18, graphs show additional modeling results for a slot waveguide and NFT according to example embodiments. In FIG. 11, a graph shows the effects of NFT cross-track overhang (see $W_{ct}$ in FIG. 5) on amount of light reflected, using $H_{dt}$=300 nm. This includes total light reflected and fundamental TE mode ($TE_{00}$) reflected. In both cases, the maximum reflected light is around $W_{ct}$=150-175 nm. In FIG. 12, a graph shows the effects of NFT down-track overhang (see $H_{dt}$ in FIG. 5) on amount of light reflected. This includes total light reflected and $TE_{00}$ mode reflected, and was modeled using $W_{ct}$=800 nm with $H_{dt}$ being the same on both top and bottom of the waveguide. In both cases, the reflection asymptotically increases with $H_{dt}$.

Figure 13:
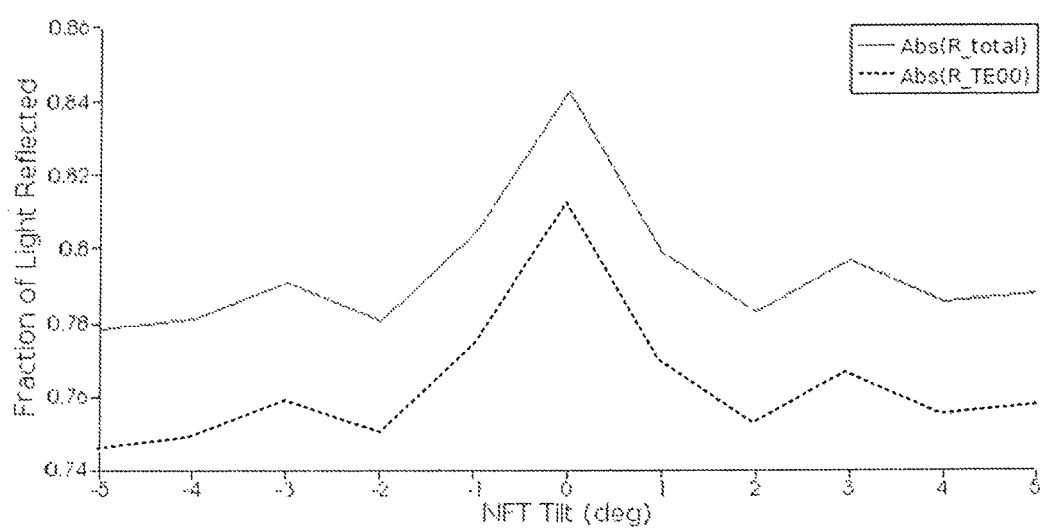
Figure 14:
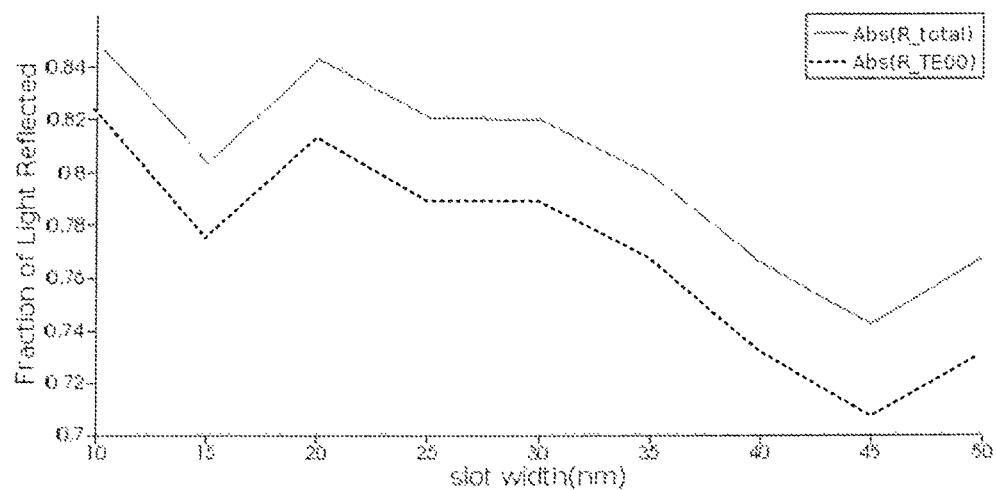
Figure 15:
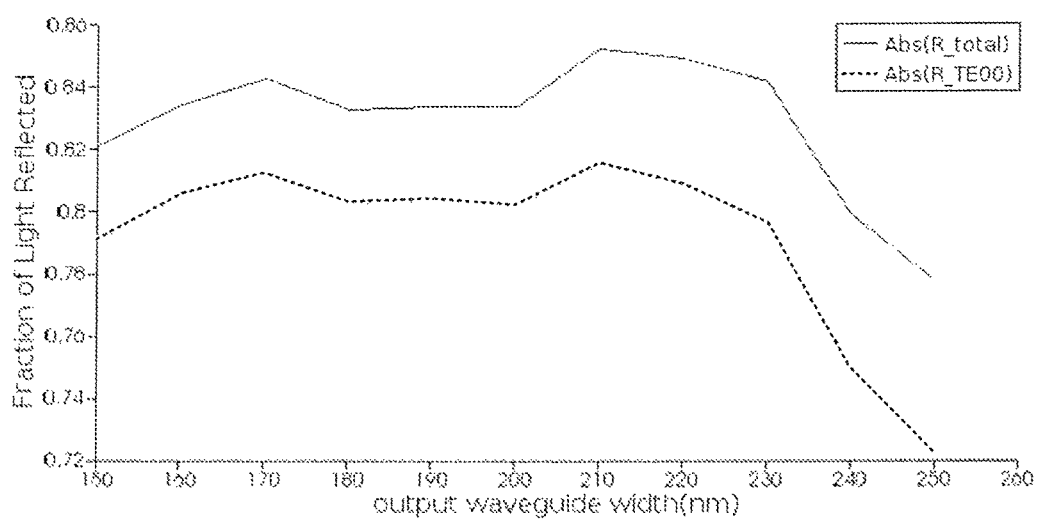

In FIG. 13, a graph shows the effects of NFT tilt on total and $TE_{00}$ mode light reflected. The tilting was in a down-track direction (rotating around the x-axis from FIG. 5 or FIG. 6) and both plates were modeled with equal tilt. In FIG. 14, a graph shows the effects of NFT slot width on total and $TE_{00}$ mode light reflected. In this example, the amount of light reflected peaks at slot width of 10 nm and 20 nm. In FIG. 15, a graph shows the effects of output waveguide cross-track width on total and $TE_{00}$ mode light reflected. This cross-track width is measured near wherein the high-index regions approach or contact the plates of the near-field transducer. In this example, the amount of light reflected peaks at waveguide width of around 210 nm.

Figure 16:
Figure 17:
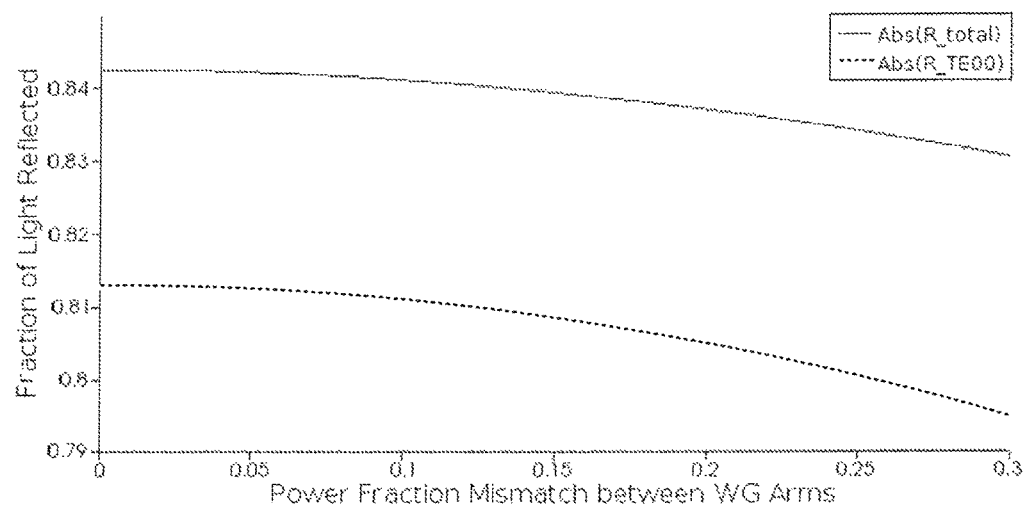

In FIG. 16, a graph shows the effects on intensity at the ABS of power mismatch between waveguide arms. Having a difference of even 30% in power coupled into each of the waveguide arms has only a small impact on the mode formed in the slot waveguide (~3% loss). Similar sensitivity is seen for percentage of power reflected back to source when the NFT structure is in place, as shown in FIG. 17.

Figure 18:
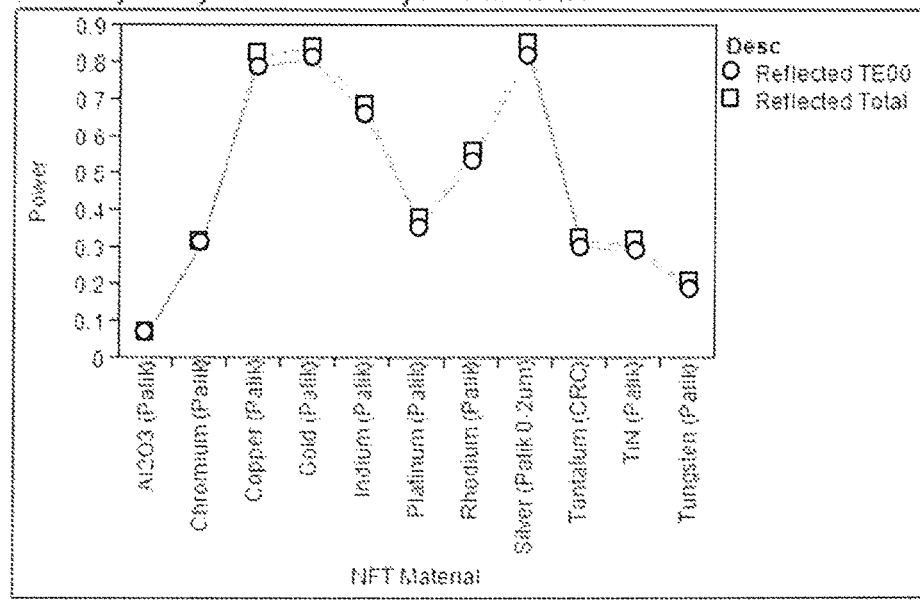

In FIG. 18, a graph shows results of modeling where a range of different materials were studied for their impact on the faction of power reflected by the NFT back towards source. Materials such as gold, silver and copper which are excellent plasmonic materials at 830 nm, also reflect the highest fraction of light. Other materials such as indium, rhodium, palladium, chromium, tantalum and TiN could also be considered, as they have other desirable characteristics, e.g., thermally robustness.

Figure 19:
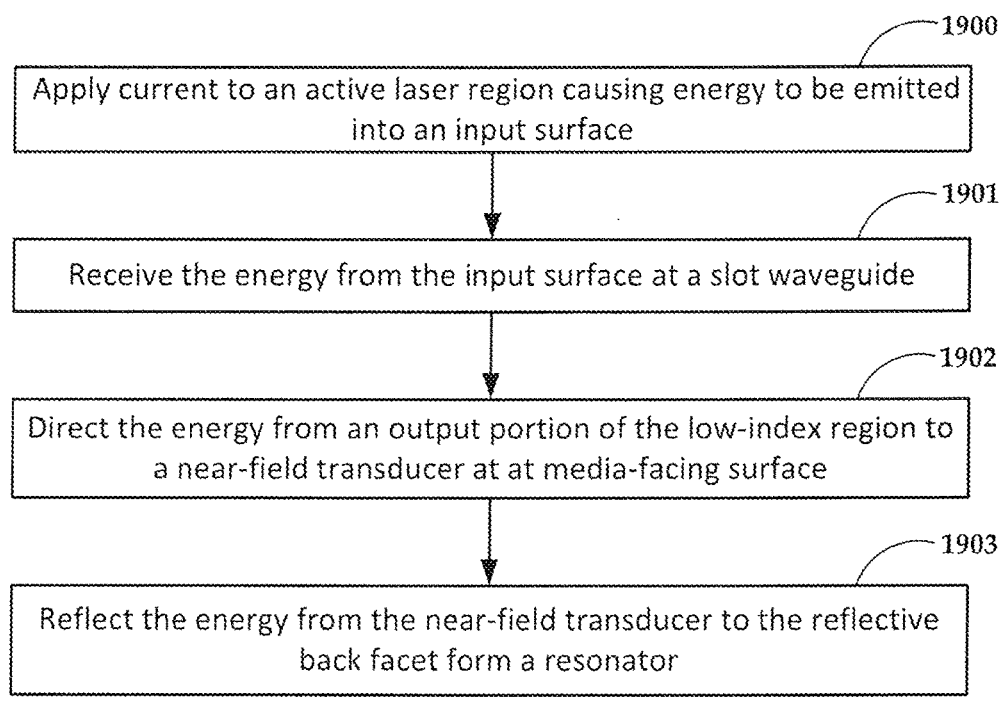
FIG. 19 is a flowchart of a method according to an example embodiment.

In FIG. 19, a flowchart illustrates a method according to an example embodiment. The method involves applying 1900 current to an active laser region with a reflective back facet and a front facet externally coupled to an input surface of a slider. The application of current causes energy to be emitted into the input surface. The energy is received 1901 from the input surface at a slot waveguide. The slot waveguide has first and second high-index regions surrounding a middle region that extends along a light propagation direction. The middle region has a refractive index less than that of the first and second high index regions. The energy is primarily coupled into the low-index region.

The energy is directed 1902 from an output portion of the low-index region to a near-field transducer at a media-facing surface. The near-field transducer has first and second plates parallel to the media-facing surface with a gap therebetween. The energy is reflected 1903 back from the near-field transducer to the reflective back facet such that the reflective back facet and the near-field transducer define a single resonator.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. An apparatus comprising:
a slider comprising:
a slot waveguide configured to receive energy from an input surface, the slot waveguide comprising first and second high-index regions surrounding a middle region that extends along a light propagation direction, the middle region having a refractive index less than that of the first and second high index regions; and
a near-field transducer at an output portion of the middle region at media-facing surface, the near-field transducer comprising first and second plates parallel to the media-facing surface with a gap therebetween; and
an active laser region with a reflective back facet and a front facet, the front facet optically coupled to the input surface of the slider, the reflective back facet and the near-field transducer defining a single optical resonator.

2. The apparatus of claim 1, wherein the first and second high-index regions have angled portions that result in a reduced cross-track width in the middle region as it approaches the media facing surface.

3. The apparatus of claim 2, wherein the first and second high-index regions have input regions of constant cross-track width near the input surface, the angled portions extending from the input regions to the media-facing surface.

4. The apparatus of claim 2, wherein the angled portions comprise tapers that result in respective first and second reduced cross-track widths in the first and second high-index regions as they approach the media-facing surface.

5. The apparatus of claim 1, wherein the first and second high-index regions are surrounded on three-sides by an intermediate-index layer and on fourth sides by a low-index layer, the intermediate-index layer forming the middle region and having an intermediate refractive index that is less than that of the high-index layer and more than that of the low-index layer.

6. The apparatus of claim 5, wherein a side of the intermediate-index layer facing away from the first and second high-index regions is covered by a second low-index layer, the intermediate refractive index being more than that of the low-index layer.

7. The apparatus of claim 1, wherein the first and second plates have an area that is larger than a corresponding cross-section of the first and second high index regions at the output portion.

8. The apparatus of claim 1, wherein the first and second plates are rectangular.

9. The apparatus of claim 1, further comprising a magnetic write pole and a heat-assisted, magnetic recording medium that is heated by surface plasmon emissions of the near-field transducer while the magnetic write pole applies a changing field to the magnetic recording medium, the surface plasmon emissions caused by a portion of the energy passing through the gap of the near-field transducer.

10. A method comprising:
applying current to an active laser region with a reflective back facet and a front facet externally coupled to an input surface of a slider, the application of the current causing energy to be emitted into the input surface;
receiving the energy from the input surface at a slot waveguide comprising first and second high-index regions surrounding a middle region that extends along a light propagation direction, the middle region having a refractive index less than that of the first and second high index regions, the energy being coupled into the middle region;
directing the energy from an output portion of the middle region to a near-field transducer at a media-facing surface, the near-field transducer comprising first and second plates parallel to the media-facing surface with a gap therebetween; and
reflecting the energy from the near-field transducer to the reflective back facet such that the reflective back facet and the near-field transducer define a single resonator.

11. The method of claim 10, wherein the first and second high-index regions have angled portions that result in a reduced cross-track width in the middle region as it approaches the media facing surface.

12. The method of claim 11, wherein the first and second high-index regions have input regions of constant cross-track width near the input surface, the angled portions extending from the input regions to the media-facing surface.

13. The method of claim 11, wherein the angled portions comprise tapers that result in respective first and second reduced cross-track widths in the first and second high-index regions as they approach the media-facing surface.

14. The method of claim 10, wherein the first and second high-index regions are surrounded on three-sides by an intermediate-index layer and on fourth sides by a low-index layer, the intermediate-index layer forming the middle region and having an intermediate refractive index that is less than that of the high-index layer and more than that of the low-index layer.

15. The method of claim 14, wherein a side of the intermediate-index layer facing away from the first and second high-index regions is covered by a second low-index layer, the intermediate refractive index being more than that of the low-index layer.

16. The method of claim 10, wherein the first and second plates have an area that is larger than a corresponding cross-section of the first and second high index regions at the output portion.

17. The method of claim 10, wherein the first and second plates are rectangular.

18. The method of claim 10, further comprising:
heating a heat-assisted, magnetic recording medium via surface plasmon emissions of the near-field transducer caused by a portion of the energy passing through the gap of the near-field transducer; and
applying a changing field to the magnetic recording medium while it is being heated.

19. A slider comprising:
a magnetic write pole near a media-facing surface; and
an external cavity resonator comprising:
an active laser region with a reflective back facet and a front facet, the front facet optically coupled to an input surface of the slider;
a slot waveguide configured to receive energy from the input surface, the slot waveguide comprising first and second tapered high-index regions surrounding a tapered middle region that extends along a light propagation direction, the middle region having a refractive index less than that of the first and second high index regions; and
a near-field transducer at an output portion of the middle region near the write pole, the near-field transducer comprising first and second plates parallel to the media-facing surface with a gap therebetween, wherein the energy reflects between the reflective back facet of the active laser region and the first and second plate to amplify the energy, a portion of the energy causing surface plasmons to resonate in the gap, the surface plasmons directed out of the media-facing surface to form a hot spot on a recording medium while the write pole applies a magnetic field to the hotspot.

20. The slider of claim 19, wherein the first and second high-index regions are surrounded on three-sides by an intermediate-index layer and on fourth sides by a low-index layer, the intermediate-index layer forming the middle region and having an intermediate refractive index that is less than that of the high-index layer and more than that of the low-index layer.

* * * * *